(12) United States Patent
Kou et al.

(10) Patent No.: US 8,799,752 B2
(45) Date of Patent: *Aug. 5, 2014

(54) MATCHING SIGNAL DYNAMIC RANGE FOR TURBO EQUALIZATION SYSTEM

(71) Applicant: SK hynix memory solutions inc., San Jose, CA (US)

(72) Inventors: Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/073,577

(22) Filed: Nov. 6, 2013

(65) Prior Publication Data

US 2014/0140384 A1     May 22, 2014

Related U.S. Application Data

(63) Continuation of application No. 13/099,162, filed on May 2, 2011, now Pat. No. 8,607,132.

(60) Provisional application No. 61/330,630, filed on May 3, 2010.

(51) Int. Cl.
*H03M 13/25* (2006.01)
*H04L 27/01* (2006.01)
*H03M 13/29* (2006.01)
*H03M 13/53* (2006.01)
*H04L 1/00* (2006.01)

(52) U.S. Cl.
CPC ........... *H04L 27/01* (2013.01); *H03M 13/2957* (2013.01); *H04L 1/0057* (2013.01)
USPC .......................................... 714/794; 714/752

(58) Field of Classification Search
CPC ............ H03M 13/2957; H03M 13/45; H03M 13/3905; H03M 13/09; H04L 1/0057; H04L 1/0061; G06F 5/01
See application file for complete search history.

(56) References Cited

U.S. PATENT DOCUMENTS

| | | | |
|---|---|---|---|
| 8,607,132 B1 * | 12/2013 | Kou et al. ...................... | 714/794 |
| 2003/0101307 A1 * | 5/2003 | Gemelli et al. ................ | 710/305 |
| 2006/0178755 A1 * | 8/2006 | Ling et al. ......................... | 700/1 |
| 2007/0086541 A1 * | 4/2007 | Moon et al. .................... | 375/267 |

* cited by examiner

*Primary Examiner* — Ajay Bhatia
*Assistant Examiner* — Dipakkumar Gandhi
(74) *Attorney, Agent, or Firm* — Van Pelt, Yi & James LLP

(57) ABSTRACT

A method for reducing a number of bits for representing a value is disclosed. A first value represented with a first number of bits is transformed to a second value represented with a second number of bits, wherein the first number of bits is greater than the second number of bits. The transformed second value is scaled by a scale factor to a third value. Transforming includes selecting a target window with a width of a third number of bits, wherein the third number of bits is smaller than the first number of bits. Transforming further includes saturating the first value to a most significant bit (MSB) within the selected target window and extracting bits within the selected target window from the saturated value.

20 Claims, 5 Drawing Sheets

MATCHING SIGNAL DYNAMIC RANGE FOR TURBO EQUALIZATION SYSTEM

CROSS REFERENCE TO OTHER APPLICATIONS

This application is a continuation of co-pending U.S. patent application Ser. No. 13/099,162, entitled MATCHING SIGNAL DYNAMIC RANGE FOR TURBO EQUALIZATION SYSTEM filed May 2, 2011 which is incorporated herein by reference for all purposes, which claims priority to U.S. Provisional Patent Application No. 61/330,630 entitled MATCHING SIGNAL DYNAMIC RANGE FOR TURBO EQUALIZATION SYSTEM filed May 3, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives. It would be desirable to develop techniques for LDPC storage applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
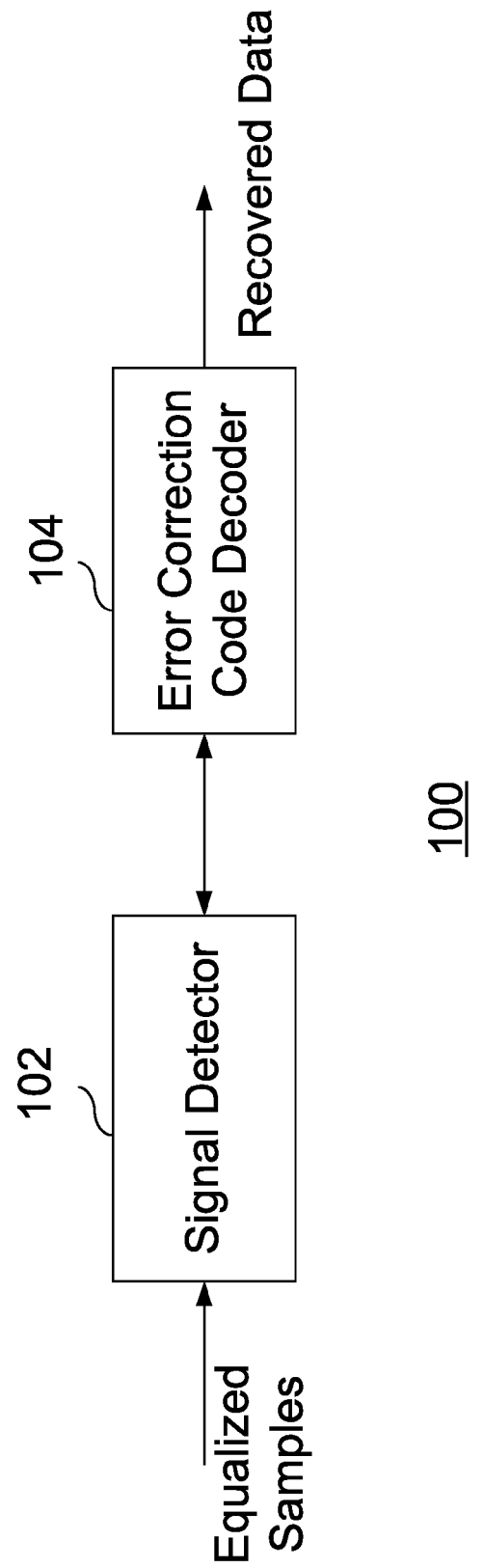
FIG. 1 is a block diagram illustrating an embodiment of a receiver system 100.

FIG. 1 is a block diagram illustrating an embodiment of a receiver system 100. In some embodiments, receiver system 100 is used to read data from storage media (e.g., Flash storage or magnetic disk storage). In some other embodiments, the techniques described herein are used in a communication system and are implemented in a wired or wireless receiver.

As shown in FIG. 1, equalized samples are fed as input into a signal detector 102. The output of signal detector 102 is then fed as input into an error correction code (ECC) decoder 104, which outputs the recovered data. In some embodiments, receiver 100 is configured as a turbo equalizer. In a turbo equalizer, a feedback loop is formed between an equalizer and ECC decoder 104. For example, the output of ECC decoder 104 may be looped back as an input to signal detector 102. The turbo equalizer repeats this iterative process until a stopping criterion is reached.

In some embodiments, signal detector 102 is a soft decision decoder providing soft information to ECC decoder 104. For example, signal detector 102 may be implemented using a soft output Viterbi algorithm (SOVA). In other examples, signal detector 102 is implemented using a Max-Log-MAP algorithm or MAP algorithm.

In some embodiments, the soft information output from signal detector 102 is a probability of a sample being a particular symbol. For example, if the samples are bit-based, then the symbols are either zero or one, i.e., the symbols form a Galois field of 2, GF(2), and thus, $$Pr(\text{sample}==1)+Pr(\text{sample}==0)=1$$

The soft information may be represented in a log-likelihood ratio (LLR), which is defined by the following equation:

$$LLR(c_i) = \log\left(\frac{Pr(c_i = 0 \mid \text{channel output for } c_i)}{Pr(c_i = 1 \mid \text{channel output for } c_i)}\right)$$

where $c_i$ is the $i^{th}$ bit of the transmitted codeword, $c_i$.

The LLR values are fed as input to ECC decoder 104. In some embodiments, ECC decoder 104 is an LDPC decoder. In various embodiments, LDPC decoder 104 may be implemented using various algorithms, including the sum-product algorithm, min-sum algorithm, and belief propagation algorithm.

The number of bits suitable for representing the LLR values computed and maintained by signal detector 102 and ECC decoder 104 can be different. Since the LLR values maintained by signal detector 102 are used to represent the competing paths for soft decoding purposes, using a greater number of bits to represent the LLR values can improve the performance of signal detector 102. ECC decoder 104, however, needs a relatively fewer number of bits for representing the LLR values to achieve a satisfactory level of decoding performance.

Since computing and maintaining values with a greater number of bits translates to more hardware, in order to reduce the amount of hardware for implementing receiver system 100, the LLR values can be maintained by signal detector 102 using a greater number of bits (e.g., ten bits), and these LLR values are then converted to LLR values represented with a fewer number of bits (e.g., six bits) before they are fed as input to ECC decoder 104. Therefore, a method for converting LLR values represented with a greater number of bits into LLR values represented with a fewer number of bits is desirable.

Figure 2:
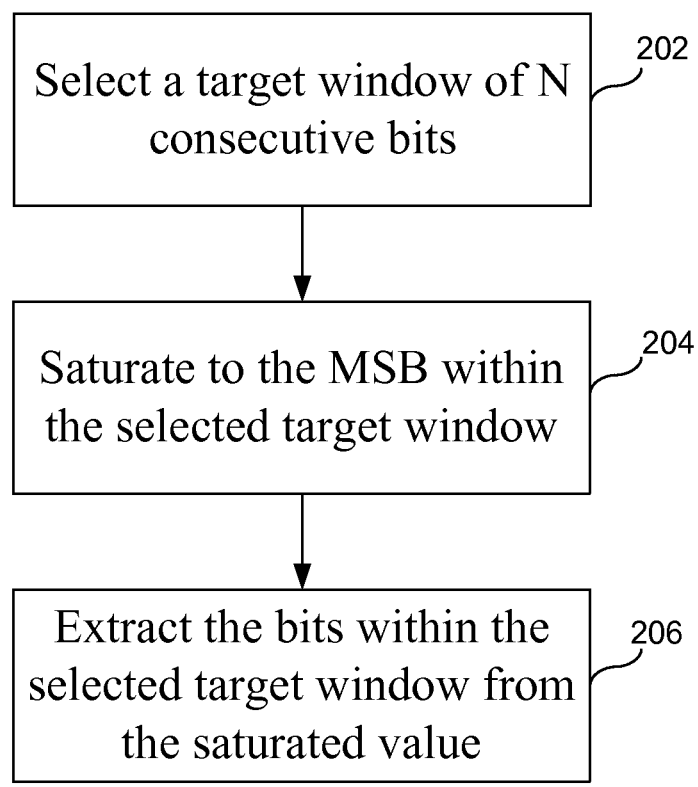
FIG. 2 is a flow chart illustrating an embodiment of a process 200 for converting an LLR value represented with M bits ($LLR_{M\text{-}bit}$) into an LLR value represented with N bits ($LLR_{N\text{-}bit}$), where M is greater than N.

FIG. 2 is a flow chart illustrating an embodiment of a process 200 for converting an LLR value represented with M bits ($LLR_{M\text{-}bit}$) into an LLR value represented with N bits ($LLR_{N\text{-}bit}$), where M is greater than N. As an illustrative example, if the LLR values computed and maintained by signal detector 102 are represented with 10 bits (M=10), and ECC decoder 104 needs only 6 bits (N=6) for representing the LLR values to achieve a satisfactory level of decoding performance, then process 200 may be used to convert an LLR value represented with 10 bits (for example, $LLR_{10\text{-}bit}=192_d=[L_{10}L_9L_8L_7L_6L_5L_4L_3L_2L_1]=[0011000000]$) into an LLR value represented with 6 bits ($LLR_{6\text{-}bit}$), which may be fed as an input to ECC decoder 104.

At 202, a target window of N consecutive bits is selected. Continuing with the illustrative example given above, any of the following target windows of 6 consecutive bits may be selected:

$[L_{10}L_9L_8L_7L_6L_5]$, $[L_9L_8L_7L_6L_5L_4]$, $[L_8L_7L_6L_5L_4L_3]$,
$[L_7L_6L_5L_4L_3L_2]$, $[L_6L_5L_4L_3L_2L_1]$

At 204, $LLR_{M\text{-}bit}$ is saturated to the $i^{th}$ bit, wherein the $i^{th}$ bit is the MSB (most significant bit) within the selected target window. Saturating a number to the $i^{th}$ bit means setting '$L_iL_{i-1} \ldots L_1$' to all ones if the input LLR value equals or exceeds $2^i$. Continuing with the illustrative example given above, if the target window selected by step 202 is $[L_7L_6L_5L_4L_3L_2]$, then the MSB within the window is the 7th bit ($L_7$). Accordingly, $LLR_{10\text{-}bit}=[L_{10}L_9L_8L_7L_6L_5L_4L_3L_2L_1]=[0011000000]$ is saturated to the $7^{th}$ bit to get $[L'_7L'_6L'_5L'_4L'_3L'_2L'_1]$, which is equal to [1111111]. In some embodiments, the saturation step at 204 may be replaced by a rounding operation.

At 206, the bits within the selected target window are extracted from the saturated LLR value obtained from step 204 by truncating the bits outside the target window. Continuing with the illustrative example given above, since the selected target window is $[L_7L_6L_5L_4L_3L_2]$, $[L'_7L'_6L'_5L'_4L'_3L'_2]$ is extracted from $[L'_7L'_6L'_5L'_4L'_3L'_2L'_1]$, which is equal to [111111]. Note that if step 206 is performed prior to step 204, identical results are obtained. Therefore, in some embodiments, the order of steps 204 and 206 may be interchanged.

Figure 3:
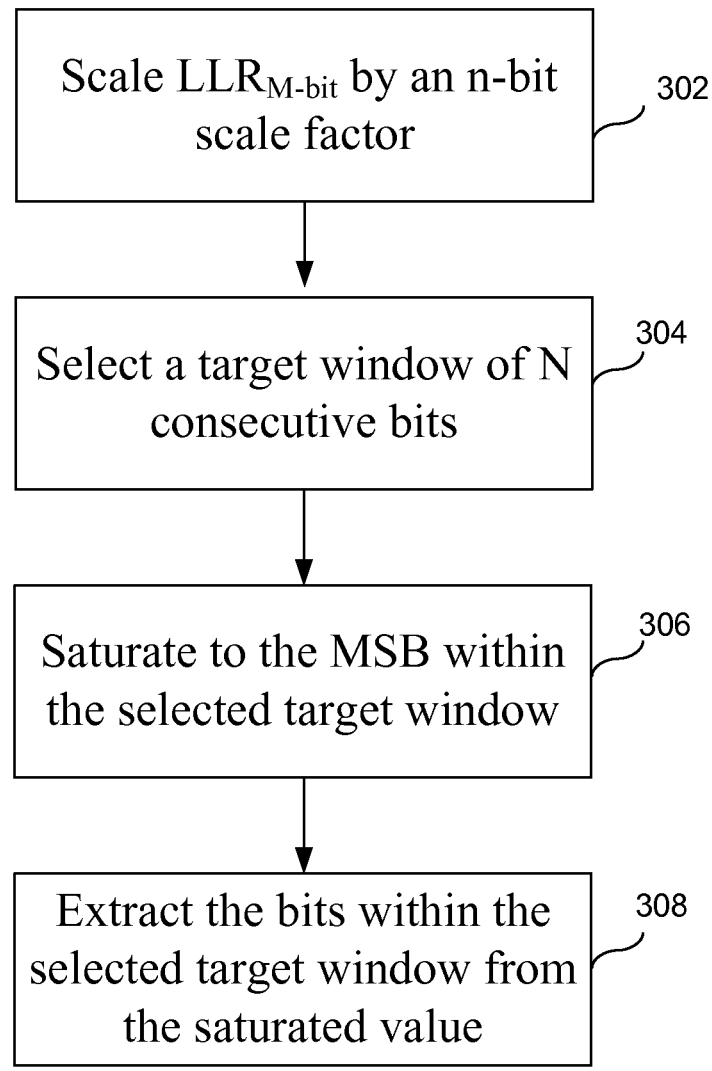
FIG. 3 is a flow chart illustrating an embodiment of a process 300 for converting an LLR value represented with M bits ($LLR_{M\text{-}bit}$) into an LLR value represented with N bits ($LLR_{N\text{-}bit}$), where M is greater than N.

FIG. 3 is a flow chart illustrating an embodiment of a process 300 for converting an LLR value represented with M bits ($LLR_{M\text{-}bit}$) into an LLR value represented with N bits ($LLR_{N\text{-}bit}$), where M is greater than N. Using the same illustrative example above, if the LLR values computed and maintained by signal detector 102 are represented with 10 bits (M=10), and ECC decoder 104 needs only 6 bits (N=6) for representing the LLR values to achieve a satisfactory level of decoding performance, then process 300 may be used to convert an LLR value represented with 10 bits ($LLR_{10\text{-}bit}=192_d=[L_{10}L_9L_8L_7L_6L_5L_4L_3L_2L_1]=[0011000000]$) into an LLR value represented with 6 bits ($LLR_{6\text{-}bit}$), which may be fed as an input to ECC decoder 104.

Process 300 scales the $LLR_{M\text{-}bit}$ value by a factor (step 302) and then transforms the scaled value to an N-bit value (steps 304-308) in a manner similar to process 200. At 302, the $LLR_{M\text{-}bit}$ value is scaled by an n-bit scale factor. For example, if $LLR_{10\text{-}bit}$ is scaled by 0.625 (i.e., the fraction ⅝) and n equals 3 bits, then step 302 is performed by multiplying $LLR_{10\text{-}bit}$ by a 3-bit representation of 5, and then right shifting the multiplied value by 3 bits (because right shifting by 3 bits is equivalent to dividing by 8) as shown below:

$$LLR_{10-bit} = 192_d$$
$$= [L_{10}L_9L_8L_7L_6L_5L_4L_3L_2L_1]$$
$$= [0011000000]$$

Scale factor = 0.625
$$= 5.8$$

$LLR_{10-bit} * \text{scale factor} = [0011000000] * 5/8$ $$[0011000000] * 101 \left\{ \begin{array}{l} 0011000000 \\ 0000000000 \\ 0011000000 \\ \hline 001111000000 \\ 001111000 \end{array} \right\} \text{Right shift by 3}$$

After scaling is performed, the same steps as in process 200 are performed. In particular, at 304, a target window of N consecutive bits is selected. For instance, a target window of $[L_7L_6L_5L_4L_3L_2]$ may be selected.

At 306, the scaled value is saturated to the $i^{th}$ bit, wherein the $i^{th}$ bit is the MSB (most significant bit) within the selected target window. Since the target window is $[L_7L_6L_5L_4L_3L_2]$, the MSB within the window is the 7th bit ($L_7$). Accordingly, the scaled value=[001111000] is saturated to the $7^{th}$ bit to obtain [1111000]. In some embodiments, the saturation step at 306 may be replaced by a rounding operation.

At 308, the bits within the selected target window are extracted from the saturated value obtained from step 306 by truncating the bits outside the target window. Continuing with the illustrative example given above, since the selected target window is $[L_7L_6L_5L_4L_3L_2]$, $[L'_7L'_6L'_5L'_4L'_3L'_2]$ is extracted from $[L'_7L'_6L'_5L'_4L'_3L'_2L'_1]$, which is equal to [111100]. Note that if step 308 is performed prior to step 306, identical results are obtained. Therefore, in some embodiments, the order of steps 306 and 308 may be interchanged.

However, process 300 involves multiplying an M-bit number with an n-bit number, which can be computationally expensive as the value of M and/or n increases.

Figure 4:
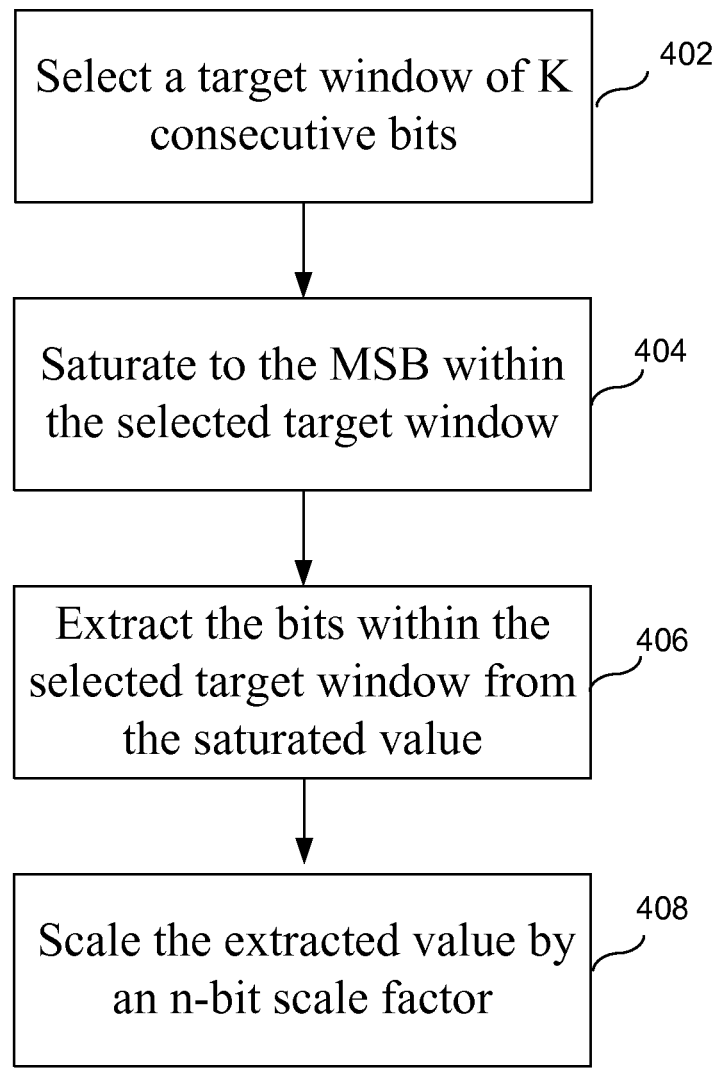
FIG. 4 is a flow chart illustrating an embodiment of a process 400 for converting an LLR value represented with M bits ($LLR_{M\text{-}bit}$) into an LLR value represented with N bits ($LLR_{N\text{-}bit}$), where M is greater than N.

FIG. 4 is a flow chart illustrating an embodiment of a process 400 for converting an LLR value represented with M bits ($LLR_{M\text{-}bit}$) into an LLR value represented with N bits ($LLR_{N\text{-}bit}$), where M is greater than N. Using the same illustrative example above, if the LLR values computed and maintained by signal detector 102 are represented with 10 bits (M=10), and ECC decoder 104 needs only 6 bits (N=6) for representing the LLR values to achieve a satisfactory level of decoding performance, then process 400 may be used to convert an LLR value represented with 10 bits ($LLR_{10\text{-}bit}=192_d=[L_{10}L_9L_8L_7L_6L_5L_4L_3L_2L_1]=$ [0011000000]) into an LLR value represented with 6 bits ($LLR_{6\text{-}bit}$), which may be fed as an input to ECC decoder 104.

Figure 5:
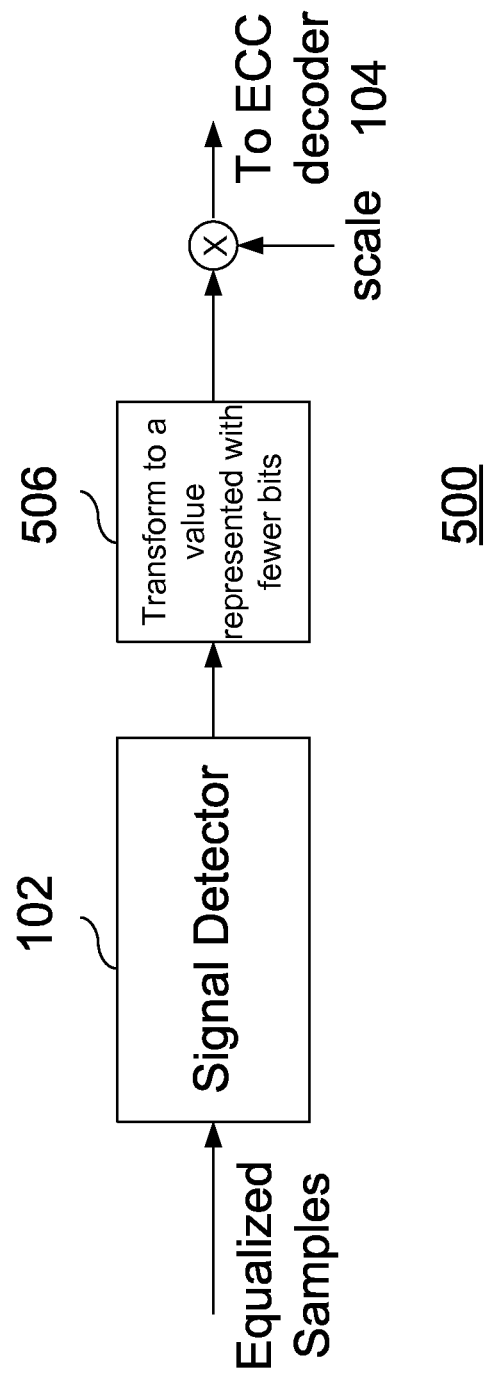
FIG. 5 is a block diagram illustrating an embodiment of a receiver system 500.

FIG. 5 is a block diagram illustrating an embodiment of a receiver system 500. Receiver system 500 may be used to implement process 400 in FIG. 4. As shown in FIG. 5, before an LLR value from signal detector 102 is fed as an input into ECC decoder 104, the LLR value is first transformed by block 506 into a value represented with fewer bits than before, and then the transformed output is scaled by a scaling factor.

Referring back to FIG. 4, at 402, a target window with a width of K consecutive bits is selected, where M is greater than K. For instance, a target window of $[L_8L_7L_6L_5L_4L_3L_2]$ may be selected.

At 404, $LLR_{M\text{-}bit}$ is saturated to the $i^{th}$ bit, wherein the $i^{th}$ bit is the MSB (most significant bit) within the selected target window. Since the target window is $[L_8L_7L_6L_5L_4L_3L_2]$, the MSB within the window is the $8^{th}$ bit ($L_8$). Accordingly, $LLR_{10\text{-}bit}=[0011000000]$ is saturated to the $8^{th}$ bit to obtain [11000000]. In some embodiments, the saturation step at 404 may be replaced by a rounding operation.

At 406, the bits within the selected target window are extracted from the saturated value obtained from step 404 by truncating the bits outside the target window. Continuing with the illustrative example given above, since the selected target window is $[L_8L_7L_6L_5L_4L_3L_2]$, $[L'_8L'_7L'_6L'_5L'_4L'_3L'_2]$ is extracted from $[L'_8L'_7L'_6L'_5L'_4L'_3L'_2L'_1]$ to yield [1100000]. Note that if step 404 is performed prior to step 406, identical results are obtained. Therefore, in some embodiments, the order of steps 404 and 406 may be interchanged.

At 408, the transformed value from step 406 is scaled by an n-bit scale factor. For example, if the transformed value from step 406 is scaled by 0.625 (i.e., the fraction ⅝) and n equals 3 bits, then step 408 is performed by multiplying the transformed value by a 3-bit representation of 5, and then right shifting the multiplied value by 3 bits (because right shifting by 3 bits is equivalent to dividing by 8) as shown below:

Transformed Value = [1100000]

Scale factor = 0.625
= 5.8

Transformed Value * scale factor = [1100000] * 5/8

$$[1100000] * 101 \left\{ \begin{array}{c} 1100000 \\ 0000000 \\ 1100000 \\ \hline 111100000 \\ 111100 \end{array} \right\} \text{Right shift by 3}$$

By transforming LLR represented with M bits to a value represented with K bits first before the scaling step, process 400 involves multiplying an K-bit value (where K is smaller than M) with an n-bit value, as opposed to multiplying an M-bit value with an n-bit value in process 300. This reduces the amount of hardware required for implementing receiver system 500 and the amount of power consumption of receiver system 500.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for reducing a number of bits for representing a value, comprising:
   transforming by a processor a first value represented with a first number of bits to a second value represented with a second number of bits, wherein the first number of bits is greater than the second number of bits, comprising:
      selecting a target window with a width of a third number of bits, wherein the third number of bits is smaller than the first number of bits, and wherein the target window comprises a window of consecutive bits not including the least significant bit; and
   scaling by the processor the transformed second value by a scale factor to a third value.

2. The method of claim 1, wherein transforming comprises:
   saturating the first value to a most significant bit (MSB) within the selected target window; and
   extracting bits within the selected target window from the saturated value.

3. The method of claim 2, wherein saturating the first value comprises setting the first value to a value of $2^i-1$ if the first value equals or exceeds $2^i$, wherein i is the MSB within the selected target window.

4. The method of claim 2, wherein extracting bits within the selected target window comprises truncating bits outside the selected target window.

5. The method of claim 1, wherein transforming comprises:
   extracting bits within the selected target window from the first value; and
   saturating the extracted value to a most significant bit (MSB) within the selected target window.

6. The method of claim 1, wherein scaling the transformed second value comprises multiplying the transformed second value with a fourth value to a fifth value.

7. The method of claim 6, wherein scaling further comprises right shifting the fifth value.

8. The method of claim 1, wherein each of the first value and the third value is a Log-likelihood ratio (LLR).

9. The method of claim 8, wherein the first value is an LLR value maintained by a signal detector, and wherein the third value is an LLR value fed as an input to an error correction code (ECC) decoder.

10. The method of claim 9, wherein the ECC decoder is an LDPC decoder.

11. A system for reducing a number of bits for representing a value, comprising:
    a receiver configured to:
       transform by a processor a first value represented with a first number of bits to a second value represented with a second number of bits, wherein the first number of bits is greater than the second number of bits, wherein transforming comprises:
          selecting a target window with a width of a third number of bits, wherein the third number of bits is smaller than the first number of bits, and wherein the target window comprises a window of consecutive bits not including the least significant bit; and scale the transformed second value by a scale factor to a third value; and an interface coupled to the receiver and configured to receive samples.

12. The system of claim 11, wherein transforming comprises:

saturating the first value to a most significant bit (MSB) within the selected target window; and extracting bits within the selected target window from the saturated value.

13. The system of claim 12, wherein saturating the first value comprises setting the first value to a value of $2^i-1$ if the first value equals or exceeds $2^i$, wherein i is the MSB within the selected target window.

14. The system of claim 12, wherein extracting bits within the selected target window comprises truncating bits outside the selected target window.

15. The system of claim 11, wherein scaling the transformed second value comprises multiplying the transformed second value with a fourth value to a fifth value.

16. The system of claim 15, wherein scaling further comprises right shifting the fifth value.

17. The system of claim 11, wherein each of the first value and the third value is a Log-likelihood ratio (LLR).

18. The system of claim 17, wherein the first value is an LLR value maintained by a signal detector, and wherein the third value is an LLR value fed as an input to an error correction code (ECC) decoder.

19. A computer program product for reducing a number of bits for representing a value, the computer program product being embodied in a non-transitory computer readable storage medium and comprising computer instructions for:

transforming a first value represented with a first number of bits to a second value represented with a second number of bits, wherein the first number of bits is greater than the second number of bits, comprising:

selecting a target window with a width of a third number of bits, wherein the third number of bits is smaller than the first number of bits, and wherein the target window comprises a window of consecutive bits not including the least significant bit; and scaling the transformed second value by a scale factor to a third value.

20. The computer program product of claim 19, wherein transforming comprises:

saturating the first value to a most significant bit (MSB) within the selected target window; and extracting bits within the selected target window from the saturated value.

* * * * *